United States Patent [19]

Hellwig et al.

[11] 4,146,848

[45] Mar. 27, 1979

[54] FREQUENCY STABILIZING SYSTEM AND METHOD FOR BEAM TYPE DEVICE

[75] Inventors: Helmut W. Hellwig; Stephen Jarvis, Jr.; David J. Wineland, all of Boulder, Colo.

[73] Assignee: The United States of America as represented by the Secretary of Commerce, Washington, D.C.

[21] Appl. No.: 870,384

[22] Filed: Jan. 18, 1978

[51] Int. Cl.$^2$ .............................................. H03B 3/12
[52] U.S. Cl. ........................................ 331/3; 324/0.5
[58] Field of Search ...................... 324/0.5; 331/3, 94

[56] References Cited

U.S. PATENT DOCUMENTS 3,060,384  10/1962  McCoubrey et al. .................. 331/3

*Primary Examiner*—John Kominski
*Attorney, Agent, or Firm*—Eugene J. Pawlikowski; Alvin J. Englert

[57] ABSTRACT

Frequency stabilization of a beam type device is disclosed that is particulary well suited for avoiding cavity phase shift problems. A beam generator provides a molecular or atomic beam that is directed through a pair of spaced and separate interaction regions to a detector. The two interaction regions, such as cavities, provide independent regions into which different signals are injected with the injected signals being derived from an oscillator such as a crystal oscillator. The signal coupled to the interaction regions may be varied according to a general equation. The first signal may also be coupled into one of the interaction regions at a frequency substantially the same as the resonance frequency of the particles in the beam directed through the cavity, while the signal coupled to the other cavity may be caused to vary above and below the resonance frequency. At the detector, the envelope of the pattern impressed on the beam is detected and a correction signal derived therefrom with the correction signal then being coupled as a feedback signal to the oscillator for frequency stabilization thereof.

22 Claims, 4 Drawing Figures

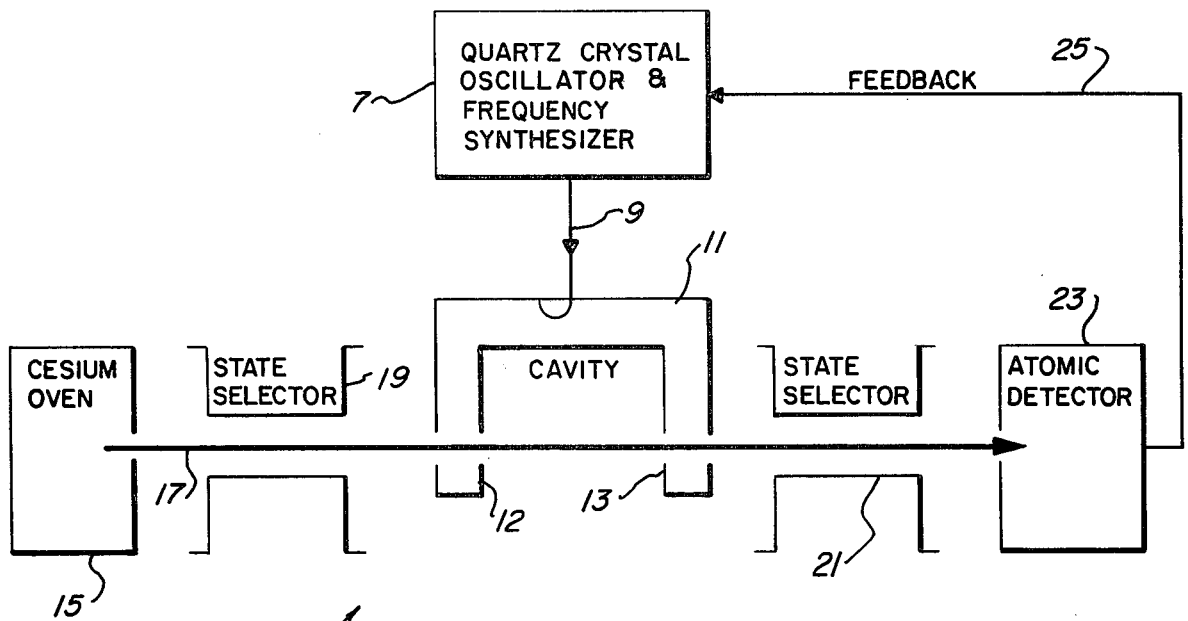
Fig_1
PRIOR ART
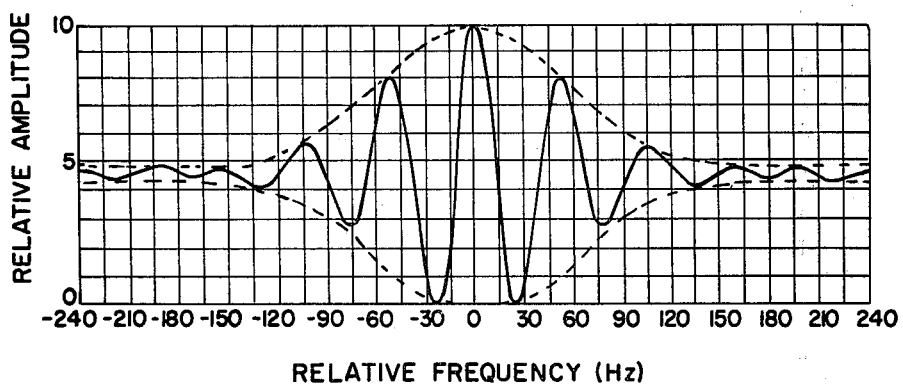
Fig_2

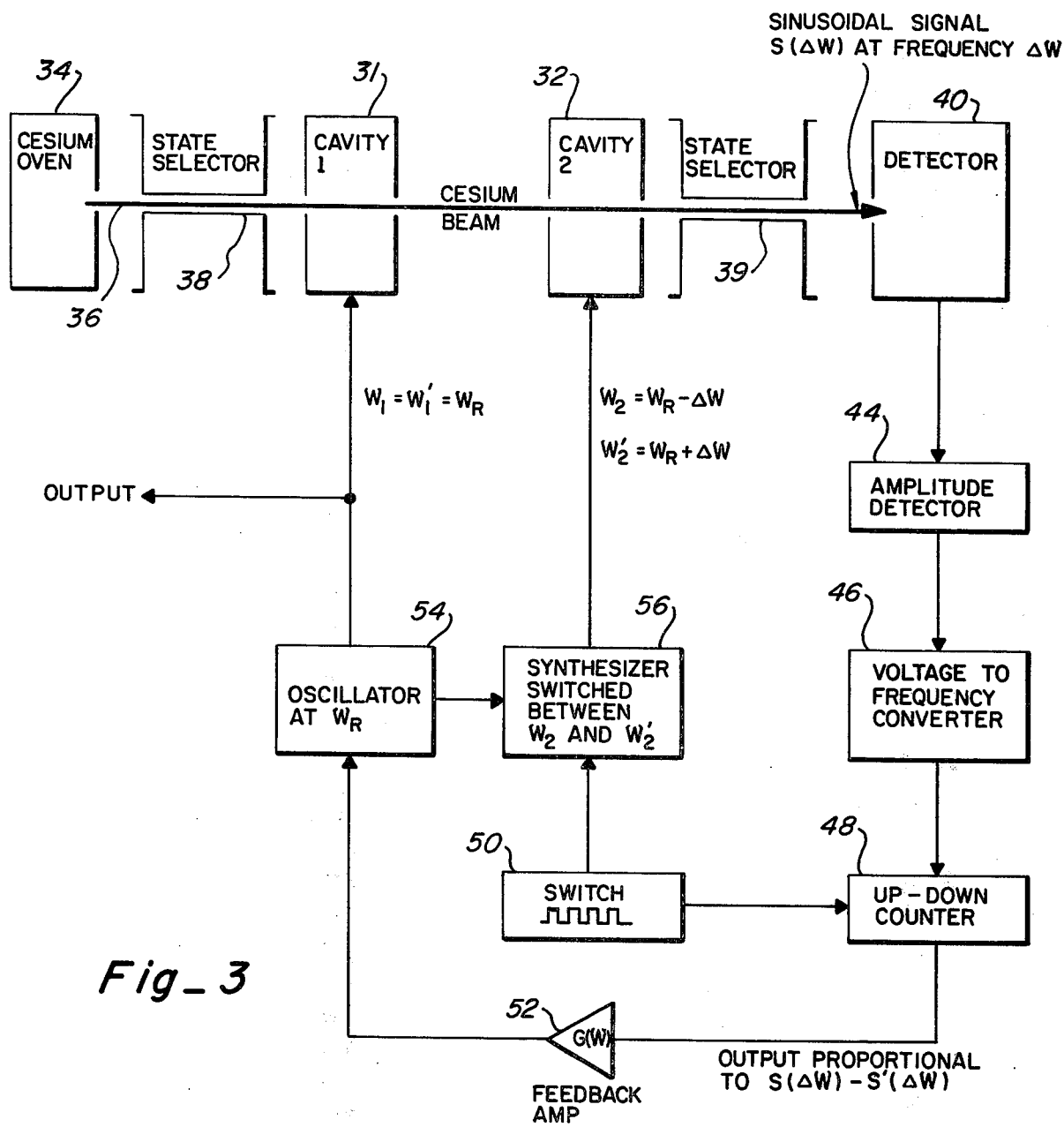
Fig_3
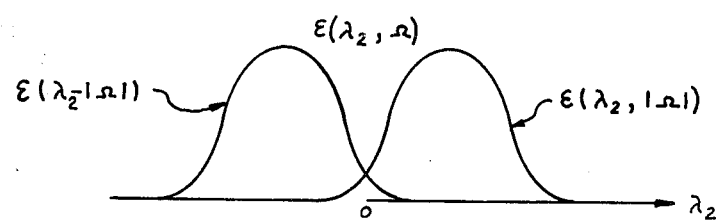
Fig_4

FREQUENCY STABILIZING SYSTEM AND METHOD FOR BEAM TYPE DEVICE

ORIGIN OF THE INVENTION

The invention described herein was made by employees of the United States Government and may be manufactured and used by or for the government for governmental purposes without the payment of any royalties thereon or therefrom.

FIELD OF THE INVENTION

The present invention relates to a frequency stabilizing system and method for a beam type device, and more particularly, relates to frequency stabilization utilizing a pair of spaced and separate microwave interaction regions having microwave signals at different frequencies coupled thereto.

BACKGROUND OF THE INVENTION

Frequency stabilizing systems for electronic apparatus are well known and have been utilized for many different types of apparatus. Stabilizing requirements can, of course, vary depending upon the intended use of the apparatus, and the degree of achieved stability can likewise vary, at least in some instances, depending upon the particular apparatus stabilized.

With respect to devices such as atomic clocks or the like, stabilizing requirements are quite stringent and apparatus of this type present unique stabilizing problems which have heretofore precluded achievement of fully satisfactory frequency stability, at least for some purposes.

Atomic clocks of many configurations have heretofore been studied, used and/or commercially produced, and it has heretofore been suggested that such clocks include systems using so-called atomic or molecular beams. For a more complete discussion of frequency standard clocks, see "Frequency Standards and Clocks: A Tutorial Introduction" By H. Hellwig, NBS Technical Note 616 (Revised) March 1974, U.S. Department of Commerce, National Bureau of Standards.

The most frequently used and important example of atomic clocks is the cesium beam atomic frequency standard or clock. Devices of this type now form the basis for time service as well as for precision navigation and communication systems, and are also used as the primary standard for the unit of time. For a more detailed review of atomic frequency standards, see "Atomic Frequency Standards: A Survey" By H. Hellwig, Proceedings of the IEEE, Vol. 63, No. 2, February 1975, and "Clocks and Measurements of Time and Frequency" by Helmut Hellwig, WESCON Technical Papers, Vol. 20, Los Angeles, Calif., Sept. 1976. For a more detailed review of the cesium beam frequency standard in realizing the unit of time see "The Realization of the Second" By Helmut Hellwig, David W. Allen, Stephen Jarvis, Jr., and David J. Glaze, Proceedings of Fifth International Conference on Atomic Masses and Fundamental Constants (AMCO-5), Paris, France, June 2-6, 1975.

Atomic or molecular resonance devices, when used as frequency standards, have heretofore commonly utilized a cavity through which a beam of particles are directed. For such a cesium standard, a cesium oven emits a beam of cesium atoms which are coupled through a magnetic field, which acts as a state selector, to the cavity which acts as an interaction region for a microwave signal coupled thereto from an oscillator, normally referenced to a crystal oscillator. From the cavity, the beam is then directed through a second magnetic field, which acts as a sorting device, to a detector, such as an atomic detector. The oscillator is controlled by a feedback loop coupled from the detector.

The properties of the cavity to a high degree determine the performance of the device as a frequency standard or clock in terms of accuracy and long-term frequency stability. During the past approximately twenty years of development of cesium beam devices, many different cavity configurations and different modulation schemes have been tried in connection therewith. Most notably, these developed cavities have been of the so-called Rabi type, which have a single, uniform cavity structure, or of the so-called Ramsey type, which have two regions of interaction, that are spatially separated but still part of the same microwave cavity. For a discussion of the Ramsey type cavity see, N. F. Ramsey, Molecular Beams, Oxford University Press, London, England, 1956. Pulse excitation of atomic and molecular beam devices having Ramsey type interaction regions is discussed in "Evaluation and Operation of Atomic Beam Tube Frequency Standards Using Time Domain Velocity Selection Modulation" by H. Hellwig, S. Jarvis, Jr., D. Halford, and H. E. Bell, Metrologia, 9, 107-172 (1973).

In the cesium standard, the properties of the cavity affect the apparent frequency of the cesium resonance, i.e., the interaction of the cavity with the resonating cesium atoms may cause an apparent shift of the resonance frequency from the true resonance frequency of the atoms. This effect is called "the cavity phase shift" because it is caused by a non-uniform phase in the microwave cavity, either an end-to-end phase or a distribution of phases along and across the atomic beam trajectory in the cavity. This cavity phase shift currently limits the absolute accuracy of primary cesium standards to about $1 \times 10^{-13}$ and the accuracy of commercial units to about $7 \times 10^{-12}$. There is also evidence that a changing cavity phase shift (changing with time) causes long-term frequency changes and instabilities (over the period of months or years) in such devices, limiting their usefulness as clocks in time generation.

Since cavity phase distribution must be kept to very small tolerances in order to produce structures acceptable for performance, this is a significant contributor to the cost of the standards because of such factors as the required mechanical precision in the production of the cavity, the required testing of the cavity, and the rejection of atomic clocks due to cavity failure found in complete standards. It has been found that the attention in fabrication and testing that must be given to the cavity may account for up to 25% of the cost of the complete structure and 50% of the beam tubes. Further refinements of present machinery tolerances and further improvements of significance beyond that known at present, without a basic technological change, appear unlikely, and thus other solutions must be found if better stability is to be achieved.

Different electromagnetic field configurations (modes) have also been used in the cavities in an attempt to optomize the properties of the resulting standard. The modulation schemes for line-center lock which have been most generally employed have been of the frequency and phase-modulation type, but sine wave and square wave modulation have been also heretofore employed. While such servo systems have, at least in some instances, improved system stability, improvements in such systems have nevertheless still been needed.

Among prior art patents, the patents to Mainberger (U.S. Pat. No. 2,960,663), Zacharais et al (U.S. Pat. No. 2,972,115), and McCoubrey et al. (U.S. Pat. No. 3,060,384) relate to atomic resonance type devices with an electronic servo system, and the patents to Orenberg (U.S. Patent No. 3,042,878), Holloway et al. (U.S. Pat. No. 3,076,942) and Grant et al (U.S. Pat. No. 3,088,078) relate to frequency locking of a device that includes a Ramsey type cavity.

Thus, while attempts have been made to increase stability in beam type devices both by careful attention to cavity construction and by providing servo systems, achievement of even better stability for these devices is still needed to make such devices more fully suitable and acceptable for use as frequency standards.

SUMMARY OF THE INVENTION

This invention provides an improved frequency stabilized beam type device with a novel frequency stabilization system and method. In this invention, a pair of spaced and independent microwave interaction regions are provided each of which is driven by signals of different frequencies with the envelope of the pattern impressed on the beam of particles at the interaction regions being detected and utilized to provide a feedback signal for frequency stabilization purposes. In this manner, cavity phase shifts are avoided.

It is therefore an object of this invention to provide an improved frequency stabilized beam type device.

It is another object of this invention to provide an improved frequency stabilized beam type device well suited for use as a frequency standard.

It is another object of this invention to provide an improved frequency stabilized beam type device having a pair of spaced and independent interaction regions driven by signals of different frequencies.

It is still another object of this invention to provide a novel frequency stabilization system and method.

It is yet another object of this invention to provide a novel frequency stabilization system and method for a beam type device having a pair of spaced and separate interaction regions driven by signals of different frequencies to produce a detectable envelope from which a correction signal is derived.

It is still another object of this invention to provide a novel frequency stabilization method for a beam type device which includes injecting signals of different frequencies into a pair of separate interaction regions to produce an envelope the detection of which enables stabilization of the device.

With these and other objects in view, which will become apparent to one skilled in the art as the description proceeds, the present invention resides in the novel construction, combination, and arrangement of parts substantially as hereinafter described and more particularly defined by the appended claims, it being understood that such changes in the precise embodiment of the herein disclosed invention are meant to be included as come within the scope of the claims.

BRIEF DESCRIPTION OF THE DRAWINGS

The accompanying drawings illustrate a complete embodiment of the invention according to the best mode so far devised for the patent application the principles thereof, and in which:

FIG. 1 is a diagramatic illustration of the basic configuration of a cesium standard known in the prior art;

FIG. 2 is a graph illustrating the resonance spectrum of a cesium beam passing through a Ramsey type cavity shown in FIG. 1;

FIG. 3 is diagramatic illustration of a frequency stabilizing system of this invention; and FIG. 4 illustrates the envelope generated by the frequency stabilization system of this invention as shown in FIG. 3.

DESCRIPTION OF THE INVENTION

The basic configuration of a known cesium standard, utilizing the Ramsey type cavity, is shown in FIG. 1 to include an oscillator 7, usually a crystal oscillator, that is utilized to couple a microwave signal to a cesium atomic resonator, or beam tube, 8, and more particularly, to inject, on line 9, a microwave signal into the cavity structure 11 which includes two separated but connected microwave interaction regions 12 and 13.

As is common for such a resonator, cesium metal is vaporized in an oven 15 and emits a beam of cesium atoms which are directed into the evacuated beam tube (as indicated by line 17). The atoms, or molecules, can be viewed as being in either one of two possible energy states, with the resonance frequency of the atoms corresponding to a transition between these two states. In order to observe the resonance, atoms of only one of the two possible states must be present. The beam is therefore directed past a first magnet 19 which serves as a state selector. In passing the magnet, the atoms in the two states are separated and a beam containing only atoms of one state is created. This state selective beam is then directed to and through the interaction regions 12 and 13. By application of a microwave signal to the cavity (on line 9) of the correct atomic resonance frequency and power, a maximum transition of the atoms is achieved from one state to the other. After passing from the cavity structure 11, the beam is directed past a second magnet 21, which magnet also serves as a state selector. At this magnet, the energy state of the atoms is detected and atoms of one of the states is focused onto an atomic detector 23.

FIG. 2 illustrates the resonance spectrum of a cesium beam passing through the Ramsey type cavity. The spectrum is obtained by measuring the beam intensity and varying the frequency of the microwave radiation in the cavity. The resulting pattern of peaks and valleys is called the "Ramsey pattern" or "Ramsey spectrum". The envelope of the pattern (shown by the dashed line in FIG. 2) is determined by the distribution of atomic velocities in the atomic beam. The wider the velocity distribution, the narrower will be the half-width of the envelope of the "Ramsey pattern".

As used herein, the expression "beam" is meant to include any selected particle groupings with particular characteristics of velocity distribution. For example, a "beam" is observed in the technique of laser saturated absorption where there are only velocities observed perpendicular to the laser beam.

In developing the envelope of the pattern, it was observed that when the cavity rf frequency is swept across the cesium hyperfine resonance, the detected signal shows a broad pedestal (the Rabi pedestal) due to single cavity transitions, with a narrower resonance structure superposed thereon called the Ramsey resonance structure with the ratios of the Rabi width to the Ramsey width being of the order of L/l.

The center of the Ramsey structure peak in precision beam tubes lies off the atomic resonance because of two principal effects (with many other effects being substantially smaller). The first offset is due to the second order Doppler effect (2DE), and from a determination of the velocity distribution of detected atoms, this effect can be calculated to a few percent. The second effect is due to the lead (designated $\delta$ where $\delta = \phi_2 - \phi_1$) of the phase of the rf field in interaction region 13 over that in interaction region 12 (see FIG. 1). At differences $\delta$ beyond measurement capability in precision tubes, the offset remains ten times larger than any other uncertainty, and care in contolling this difference is one of the principal problems in commercial tube construction.

Near the center of the resonance curve $g(\lambda)$, the approximation $$g(\lambda;\delta) = A + \int dT B (T,b) \cos(\lambda T - \delta) \qquad (1)$$

holds, where A is independent of $\lambda$, B depends on the rf field strength b and "velocity" distribution $\rho(T)$, $T = L/V$ is the intercavity "period" for an atom with velocity V, and $\lambda = \omega - \omega_o$ is the offset from the atomic resonance in angular frequency (2DE being hereafter ignored since it generates an additive offset).

If $\delta$ is swept continuously through 0 to $2\pi$ radians, the interference pattern $g(\lambda)$ generates an envelope $\epsilon(\lambda)$ as follows:

$$g(\lambda;\epsilon) = A + \cos\epsilon \int dT \cos\lambda T\, B(T,b) - \sin\delta \int dT$$
$$\sin\lambda T\, B(T,b)\ \epsilon(\lambda) = \{[\int dTB \cos\lambda T]^2 + [\int dTB \sin\lambda T]^2\}^{\frac{1}{2}} \qquad (2)$$

For most beam tubes in which the velocity distribution is broad, the envelope is only two or three times broader than the central peak of the resonance line $g(\lambda)$, and it is symmetric about the atomic resonance $\lambda = 0$ independent of the phase error $\delta$.

As indicated in FIG. 1, detector 23 produces an electric signal which is then processed and fed back on lead 25 to oscillator 7 to control the same. The oscillator is thus controlled via a servo loop by the cesium atomic resonator. In order to lock the oscillator to the atomic resonance, the resonance is interrogated in order to produce an electrical signal at the detector which indicates how large a frequency offset exists (if any) from the atomic line-center and on which side of line-center the frequency offset is located.

The basic cesium standard is well known and is described in greater detail in the references cited hereinabove, and particularly with respect to the publication entitled "Frequency Standard Clock: A Tutorial Introduction" cited hereinabove, all of said references being hereby incorporated herein by reference.

This invention requires recognition that the envelope of the Ramsey pattern can be invariant against cavity phase shifts. In other words, the center of the envelope, in contrast to the center of the main peak of the resonance, does not shift with varying cavity phase shifts, with respect to the cesium atomic resonance itself. This invention provides a system and method to realize the envelope and lock a crystal oscillator to the center of the envelope, thus avoiding cavity phase shift problems.

In this invention, two separate (and thus independent) microwave interaction regions (designated 31 and 32 in FIG. 3) are utilized. As indicated in FIG. 3, these interaction regions, or cavities, are spaced from one another and are not part of the same cavity. As also indicated in FIG. 3, the cavities are positioned so that the beam of particles (molecular or atomic beam) are directed from the beam generator 34 (shown as a cesium oven) along line 36 so that the beam first passes through cavity 31 and then through cavity 32. As also shown in FIG. 3, state selectors (magnets) 38 and 39 and detector 40 are utilized in the same manner described in connection with the resonator shown in FIG. 1.

Cavities 31 and 32 are driven by signals of two different frequencies $\omega_1$ and $\omega_2$, which two frequencies have a fixed frequency relationship to one another ($\omega_2 = \omega_1 + \Omega$).

Frequency difference $\omega$ leads to a continuously swept phase $\delta$ wherein $\delta = \Omega t + \delta_o$ and envelope detection gives an envelope $\epsilon(\lambda,\Omega)$ which is completely symmetric about $\lambda = 0$ when $\Omega$ is negligibly small.

It is not practical, however, to servo the resonance line center for values of $\Omega$ small enough for the above theory to apply immediately. However, for values of $\Omega$ of practical size, a resonance structure can be generated which is independent of $\delta_o$ and is symmetric about $\lambda$(neglecting, again, 2DE and other smaller effects).

By solving the equations for the transition probability with cavity frequencies $\omega_1$ and $\omega_2 = \omega_1 + \Omega$, and averaging over the distribution of T and forming the envelope $\epsilon(\omega_1,\omega_2)$ obtained from the $\Omega$ t-modulated resonance signal seen at the detector, $\epsilon^2$ is obtained:

$$\epsilon^2(\omega_1,\omega_2) = S(\lambda_2-\mu\Omega) + \Omega A(\lambda_2-\mu\Omega) \qquad (3)$$

$$\lambda_2 \equiv \omega_2 - \omega_o \qquad (4)$$

where S is symmetric in $\lambda_2-\mu\Omega$, A is antisymmetric, and S and A depend on $\Omega^2$, and:
$$\mu = 1 + l/L + D/L \qquad (5)$$

where D is the distance between cavity and detector. When the sign of $\Omega$ is reversed, the envelope generates its mirror image about the line $\lambda_2 = 0$ as shown in FIG. 4.

The above detailed theory demonstrates that small uncompensated asymmetries in the structure due to variations in the phase $\phi_2(p_A) - \phi_1(p_B)$ in the ith cavity between rays $(p_A,p_B)$ contributed to the detected beam can be reduced in several ways. These effects are also present in the standard beam tube. If the velocity (period)-ray distribution $p(T,p)$ is separable, i.e., has the same form on each detected ray, $p(T,p) = p(T) \delta(p)$, the asymmetry due to the distributed cavity phase differences $\phi_2(p_A) - \phi_1(p_B)$ vanishes. Design of beam optics and properly chosen state selection and detection methods (e.g. optical means) can contribute to this requirement. The same is quite consistent with the goal of narrow envelope generation by using broad velocity distributions. Supercooled cavities (no $\phi(p)$ within a cavity) are relatively easy in this two-cavity apparatus.

It might also be noted that line pulling due to adjacent resonances vanishes in envelope detection. At low rate $\Omega$, the outer symmetries may be servoed, while for high rates, the inner symmetries can be used (see FIG. 4), with the combination thereof providing useful redundancy.

In this invention, the atoms in the beam are subjected in sequence to frequency $\omega_1$ in cavity 31, and then to frequency $\omega_2$ in cavity 32. To the atom, this is equivalent to a time-varying cavity phase shift between the two interaction regions and this phase shift depends upon the time-of-flight of the atoms between the two interaction regions and on the frequency difference $\omega_1 - \omega_2$. At the detector, there is a sinusoidally varying "signal" at frequency $\omega_1 - \omega_2$ whose magnitude depends upon $\omega_1 - \omega_o$ and $\omega_2 - \omega_o$ where $\omega_o$ is the atomic frequency.

Frequencies $\omega_1'$ and $\omega_2'$ are then applied to cavities 31 and 32, respectively. If $\omega_2' - \omega_1' = -(\omega_2 - \omega_1)$, then the signal at the detectors has the same amplitude only when $(\omega_1 + \omega_1')/2 = \omega_o = (\omega_2 + \omega_2')/2$. For this resonance condition, any of the applied frequencies ($\omega_1$, $\omega_1'$, $\omega_2$, and $\omega_2'$) can be directly related to $\omega_o$.

In greater detail, the resonance sample is interrogated by two time-delayed pulses of radiation (as in the original method developed by N. F. Ramsey). The difference, however, is in that the rf phase of the second pulse is allowed to advance (or recede) at a constant rate; that is, the rf frequency of the second pulse is offset from that of the first. In a resonance sample where there is time dispersion between the two pulses (e.g., atomic beam with velocity spread which uses the separated oscillatory field technique) one can observe the envelope of the resonance spectrum (Ramsey pattern) which is symmetric with respect to rf phase shift between the two interaction regions while the Ramsey pattern itself, in general is not.

In an atomic beam apparatus using separated oscillatory fields, the probability (near resonance) that an atom has made a transition from state p to state q is given by:

$$p_{p,q}(\omega - \omega_o, \delta) = A(b,\tau) \cos^2 \tfrac{1}{2} [(\omega - \omega_o) T - \delta] =$$
$$A(b,\tau) \{\cos[(\omega - \omega_o) T - \delta] + 1\}/2 \quad (6)$$

where A is a function of the rf field strength (b) and time spent ($\tau$) in each interaction region, $\omega$ is the frequency of the applied rf field, $\omega_o$ is the atomic resonance frequency, T is the time spent between interaction regions, and $\delta$ is the rf phase (lead) angle of the second interaction region with respect to the first. In general, in an atomic beam apparatus, T has a distribution B(T) of values over the beam (velocity spread). Therefore, for large $|\omega - \omega_o|$, $P_{p,q}$ approaches a constant value when averaged over the beam. In this case a signal (Ramsey pattern) $g(\omega - \omega_o, \delta)$ is given by:

$$g(\omega - \omega_o, \delta) = C + \int dT\, B'(T) \cos[(\omega - \omega_o) T - \delta] \quad (7)$$

where C = constant and $B'(T) = B(T)A(b,\tau)/2$.

The central peak of the Ramsey pattern occurs approximately when $\omega - \omega_o \cong \delta/\langle T \rangle$ where $\langle T \rangle$ is the average transit time between interaction regions. This systematic shift can be made small by making the two interaction regions be different portions of a single high-Q cavity, thus ensuring that $|E|$ is small. However, practical limitations exist, and even a cesium beam frequency standard where $|E|$ can be as small as 0.5 milliradians, fractional frequency offsets of $10^{-11}$ can occur (T $\cong 10^{-13}$ sec) which are three orders of magnitude worse than the resolutions which are obtained. Superconducting cavities could be used to make $|\tau|$ significantly smaller; however, obvious practical limitations make this suitable for rather special situations only.

If $\delta$ is now varied slowly, i.e., $\delta = \delta_o + \omega_m t$, ($\omega_m \ll 1/T$) so that the first interaction region has frequency $\omega$ and the second has frequency $\omega + \omega_m$, the signal $g(\omega - \omega_o, \delta)$ varies sinusoidally at a frequency $\omega_m$ with amplitude $$S(\omega) = \{[\int dT\, B'(T) \cos(\omega - \omega_o)T]^2 + [\int dT\, B'(T) \sin(\omega - \omega_o)T]^2\}^{\tfrac{1}{2}}.$$

The amplitude of the envelope of the Ramsey pattern is given by $S(\omega)$. As asserted above, $S(\omega)$ is symmetric with respect to $(\omega - \omega_o)$. Therefore, the resonance condition $\omega - \omega_o = 0$ can be found, for example, by applying rf radiation at $\omega + \Delta\omega$, alternating $\Delta\omega$ between $+ \Delta\omega_e/2$ and $- \Delta\omega_e/2$ ($\Delta\omega_e =$ half width of envelope) and looking for equal amplitude of $S(\omega)$. Even if transit time effects to the detector are taken into account with $\omega_m = 1/T$ it can be shown from Eq. (8) that symmetry about $\omega_o$ is obtained if the signs of $\Delta\omega$ and $\omega_m$ are changed simultaneously. An important practical case is realized if we let the first interaction region be driven at $\omega$ and the second interaction region be driven alternately at $\omega + \omega_m$ and $\omega - \omega_m$ ($\omega_m \cong 1/T$). $\omega$ is then servoed so that $S(\omega)$ is the same for both conditions; thus $\omega = \omega_o$. One slight disadvantage of this method is that the Ramsey envelope is broader than the central Ramsey peak obtained in the usual arrangement. However, this loss of resolution should not have to be more than a factor of two or three for a beam with a broad (e.g., Maxwellian) distribution.

An example of a frequency stabilizing system according to this invention is shown in FIG. 3. As shown, amplitude detector 44 is connected with detector 40 to detect the envelope of the pattern impressed on the beam by the different interrogating frequencies injected into cavities 31 and 32.

As used herein, the "detector" is meant to imply any means for observing a change in atomic or molecular state of a beam received by the detector.

The output from the amplitude detector is coupled to voltage-to-frequency converter 46 with the output from the converter being coupled to up-down counter 48 which is also connected with switch 50. The output from the cavity is a correction signal that is coupled through feedback amplifier 52 to oscillator 54 (a crystal oscillator) to control the frequency of the oscillator.

As shown in FIG. 3, oscillator 54 provides an output substantially at the predetermined resonance frequency ($\omega_r$) of the beam and this output may be coupled to cavity 31 both as the $\omega_1$ and $\omega_1'$ inputs thereto.

Oscillator 54, as shown in FIG. 3, provides a microwave source of radiation. It is to be appreciated, however, that oscillator 54, in conjunction with other suitable interaction regions, could provide frequencies other than in the microwave region, such as, for example, a laser oscillator with cavities formed by reflecting mirrors or the like.

Oscillator 54 also provides an output to synthesizer 56 which provides a $\omega_2$ output at $\omega_r - \Delta\omega$ and $\omega_2'$ at $\omega_r + \Delta\omega$. Switch 50 is connected with the synthesizer to control application of either of $\omega_2$ or $\omega_2'$ to cavity 32. As shown, $\omega_2$ and $\omega_2'$ are preferably alternately coupled to the cavity for like periods of time.

As shown in FIG. 3, $\omega_1' = \omega_1 = \omega_r$, $\omega_2 = \omega_r - \Delta\omega$, and $\omega_2' = \omega_r + \Delta\omega$ where $\Delta\omega$ is equal or similar to $1/T$ and where T is the approximate transient time of the atoms between the two cavities 31 and 32. The servo then defines a condition where $S(\Delta\omega) = S'(\Delta\omega)$ which is true only when $\omega_r = \omega_o$.

As can be appreciated from the foregoing, this invention provides an atomic beam frequency standard or clock that has a different cavity structure and electronic design that results in a device that avoids the adverse effects of cavity phase shift. By eliminating cavity phase shift, an important element can be realized in achievable accuracy of laboratory type frequency standards, and an even greater improvement in accuracy can be realized in commercially produced units.

In addition, long-term stability and clock performance can be enhanced since: the absence of a cavity phase shift causes the absence of a time dependence of this shift and the associated frequency shifts; the resonance line usually is influenced by other resonances in cesium which are separated from $\omega_r$ as a function of magnetic fields (this invention reduces influence by orders of magnitude); and the resonance frequency of the microwave cavity also affects the frequency of the standard (since very low cavity quality factors can be used in this invention, this effect is very highly reduced).

This invention can also be achieved with no increased complexity or cost with respect to the associated electronics, and, the degree of electronic complexity is believed to be unchanged compared to present day electronic systems. The cavity interaction regions, however, can be produced at a fraction of the cost of the present Ramsey type cavities since no requirement for precision or phase coherence between the two cavities is needed.

Thus, this invention provides frequency stabilization for beam type devices that enables both cost savings and improved performance.

What is claimed is:

1. A beam type device that is frequency stabilized to avoid adverse effects of interaction region phase shift, said device comprising:
   beam generating means for producing a beam of particles resonating at a predetermined resonance frequency;
   first and second interaction region defining means positioned to receive said beam of particles from said beam generating means;
   signal generating means providing output signals at different preselected frequencies with the output signal coupled to said first interaction region defining means being different from that coupled to said second interaction region defining means;
   detector means positioned to receive said beam of particles from said interaction region defining means and providing therefrom an output indicative of frequency offsets of said output signals from said signal generating means from said predetermined resonance frequency due to interaction region phase shift; and
   signal processing means connected to said detector means and said signal generating means for receiving said output from said detector means and responsive thereto automatically frequency controlling said signal generating means so that said signal generating means is stabilized at said predetermined resonance frequency.

2. The frequency stabilized device of claim 1 wherein said generating means produces an atomic or molecular beam, and wherein said first and second interaction region defining means are cavities that are separate from and spaced with respect to one another with said beam being directed sequentially through said cavities whereby said beam is sequentially driven by output signals at different frequencies from said signal generating means.

3. The frequency stabilized device of claim 1 wherein said signal generating means includes first means providing an output signal substantially at said predetermined resonance frequency and second means providing output signals at selectable frequencies related to but different than said predetermined resonance frequency.

4. The frequency stabilizing device of claim 3 wherein said second means provides output signals at frequencies substantially the same amount above and below said predetermined resonance frequency, and wherein said output signals from said second means are alternately coupled to said second interaction region defining means.

5. The frequency stabilizing device of claim 1 wherein said detector means includes an amplitude detector.

6. The frequency stabilizing device of claim 5 wherein said signal processing means includes a voltage-to-frequency converter and a counter.

7. A beam type device that is frequency stabilized to avoid adverse effects of interaction region phase shift, said device comprising:
   beam generating means for producing a beam of particles resonating at a predetermined resonance frequency;
   first and second interaction region defining means positioned to receive said beam of particles from said beam generating means;
   signal generating means providing a first output signal for coupling to said first interaction region defining means and a second output signal for coupling to said second interaction region defining means at the same time that said first output signal is coupled to said first interaction region defining means, said first and second output signals being at different predetermined frequencies with at least one of said first and second output signals being frequency selectable between at least two different but related frequencies;
   signal selection means connected with said signal generating means to select said output signals coupled to said interaction region defining means by said signal generating means;
   detector means for receiving said beam of particles from said first and second interaction region defining means and providing an output indicative of frequency offsets of said output signals from said signal generating means from said predetermined resonance frequency due to interaction region phase shift; and
   signal processing means connected to said detector means and said signal generating means for receiving said signal from said detector means and responsive thereto automatically frequency stabilizing said signal generating means.

8. The frequency stabilized device of claim 7 wherein said beam produced by said beam generating means is an atomic or molecular beam, wherein said first and second interaction region defining means are cavities separate from and spaced with respect to one another with said beam being directed sequentially therethrough, and wherein said output signal coupled to said first cavity is substantially at said predetermined resonance frequency while said output signal coupled to said second cavity is at a frequency different from but related to that of said preselected resonance frequency.

9. The frequency stabilized device of claim 8 wherein said signal coupled to said second cavity is selectable between a frequency above and below that of said predetermined resonance frequency, and wherein said signal selection means causes said output signal coupled to said second cavity to be alternated between said frequencies above and below said predetermined resonance frequency.

10. A frequency stabilized beam type device, comprising:
   a beam generator providing a molecular or atomic beam and directing the same toward an interaction area, said molecules or atoms in said beam resonating at a predetermined resonance frequency;
   first and second spaced and separate cavities at said interaction area, said cavities being positioned so that said beam from said beam generator passes through said first cavity before passing through said second cavity;
   an oscillator providing an output signal;
   first signal coupling means connected with said oscillator to receive said output signal therefrom and couple a signal to said first cavity substantially at said predetermined resonance frequency;
   second signal coupling means connected with said oscillator to receive said output signal therefrom and responsive thereto providing a signal to said second cavity that is selectable between a signal having a frequency greater than said predetermined resonance frequency and a frequency less than said predetermined resonance frequency, said signals being simultaneously applied to said first and second cavities;
   switching means connected with said second signal coupling means to alternately cause coupling of said selectable signals to said second cavity;
   detector means positioned to receive said beam after said beam passes through said first and second cavities at said interaction area and providing therefrom an amplitude variable output indicative of frequency offsets of said output signals from said signal generating means from said predetermined resonance frequency;
   frequency converting means receiving said amplitude variable output from said detector means and responsive thereto providing correction signal arising substantially from cavity phase shifts that might have occurred in said cavity; and
   correction signal coupling means for coupling said correction signal to said oscillator to thereby control the frequency of the output signal therefrom to thus frequency stabilize the same.

11. The frequency stabilized device of claim 10 wherein said beam generator is a cesium oven emitting a beam of cesium atoms, and wherein said detector means includes an atomic detector and an amplitude detector.

12. The frequency stabilized device of claim 10 wherein said frequency converting means includes an up-down counter and a voltage-to-frequency converter with said counter being connected to said switching means and said voltage frequency counter being connected to said detector means, and wherein said correction signal coupling means includes a feedback amplifier receiving the output from said up-down counter.

13. A stabilizing system for a beam type device for frequency stabilizing said device to avoid adverse effects of interaction region phase shift, with said device having a beam generator directing a beam of particles resonating at a predetermined resonating frequency through a pair of spaced interaction regions to a detector, said stabilizing system comprising:
   signal generating means providing simultaneous output signals at different frequencies to different ones of said first and second interaction regions with one of said output signals having a frequency substantially the same as said predetermined resonance frequency; and
   signal processing means connected with said detector and said signal generating means for receiving an output from said detector and responsive thereto automatically frequency controlling said signal generating means so that one of said output signal is stabilized at said predetermined resonance frequency.

14. The stabilizing system of claim 13 wherein said signal generating means includes an oscillator providing an output substantially at said predetermined resonance frequency to one of said interaction regions, synthesizer means receiving an output from said oscillator and providing an output signal to the other of said interaction regions at one of two frequencies both of which differ from said predetermined resonance frequency but are related thereto, and switching means connected with said synthesizer to cause said output to the other of said interaction regions to be alternated between said two frequencies related to said predetermined resonance frequency.

15. The stabilizing system of claim 13 wherein said signal processing device includes amplitude detector means for detecting the envelope of the pattern impressed on said beam at said cavity, and frequency converting means for developing a correction signal therefrom.

16. A stabilizing system for a beam type device for frequency stabilizing said device to avoid adverse effects of cavity phase shift, said device having a beam generator directing a molecular or atomic beam resonating at a predetermined resonance frequency through a pair of spaced and separate cavities to a detector, said stabilizing system comprising:
   an oscillator providing an output;
   first signal coupling means receiving said output from said oscillator and providing a signal to one of said cavities at a frequency substantially the same as said predetermined resonance frequency;
   a synthesizer receiving the output from said oscillator and providing an output selectable between a first frequency greater than said predetermined resonance frequency and a second frequency less than said predetermined resonance frequency with said deviations of first and second frequencies from said predetermined resonance frequency being substantially the same;
   switching means connected with said synthesizer controlling the frequency of said output from said synthesizer so that said output is alternated between said first and second frequencies;
   second signal coupling means connected with said synthesizer to couple said output therefrom to the other of said cavities at the same time that said signal from said first signal coupling means is coupled to said one cavity;
   an amplitude detector connected with said detector to detect the envelope of the pattern impressed on said beam by said signals coupled to said cavities;
   a voltage-to-frequency converter connected with said amplitude detector to receive the output therefrom;

an up-down counter connected to said voltage-to-frequency converter and to said switching means; and a feedback amplifier connected to said up-down counter with the output of said amplifier being coupled to said oscillator to frequency stabilize said oscillator.

17. A method for frequency stabilizing a beam type device to avoid adverse effects of interaction region phase shift, said method comprising:

providing a pair of separate and spaced interaction regions;

directing a beam of particles resonating at a predetermined resonance frequency through each of said interaction regions in succession;

injecting a first signal from an oscillator at a frequency $\omega_1$ into one of said interaction regions;

injecting a second signal derived from said oscillator at a frequency $\omega_2$ into the other of said interaction regions at the same time that said first signal is injected into said one interaction region;

varying the frequency of at least one of said signals injected into said interaction regions;

determining the envelope of the pattern impressed on said beam by said signals injected into said interaction regions; and utilizing said predetermined envelope to frequency stabilize said oscillator.

18. The method of claim 17 wherein both of said signals $\omega_1$ and $\omega_2$ are varied in a relationship where $\omega_2' - \omega_1' = -(\omega_2 - \omega_1)$, where $\omega_1'$ and $\omega_2'$ are the varied signals injected into said first and second interaction regions, respectively.

19. The method of claim 17 wherein said beam is a molecular or atomic beam, and wherein said signals injected into said cavities are microwave signals with the frequency of second signal varying both above and below said predetermined resonance frequency.

20. The method of claim 17 wherein the frequency of said second signal is varied by switching the same between a frequency greater than said predetermined resonance frequency and a frequency less than said predetermined resonance frequency.

21. The method of claim 17 wherein said envelope is determined by amplitude detection, and wherein said envelope is utilized by frequency conversion of the detected amplitude.

22. A method for frequency stabilizing a beam type device having an atomic or molecular beam resonating at a predetermined resonance frequency passing through first and second separate and spaced cavities to a detector, said method comprising:

providing an oscillator;

injecting a signal from said oscillator into said first cavity at a frequency substantially the same as said predetermined resonance frequency;

deriving a pair of signals from said oscillator that differ by substantially the same amount above and below said predetermined frequency;

alternatively injecting each of said pair of signals into said second cavity at the same time that said signal is injected into said first cavity;

detecting the envelope of the pattern impressed on said beam by signals injected into said cavity;

converting the detecting envelope to a correction signal; and utilizing said correction signal to control the frequency of said oscillator and thereby frequency stabilize said device particularly with respect to the effects of cavity phase shift.

* * * * *

UNITED STATES PATENT OFFICE
CERTIFICATE OF CORRECTION

Patent No. 4,146,848            Dated March 27, 1979

Inventor(s) Helmut W. Hellwig et al.

It is certified that error appears in the above-identified patent and that said Letters Patent are hereby corrected as shown below:

Column 5, line 28, "$\varepsilon$" (both occurrences) should read --$\delta$--; line 29, "sin$\lambda$TB(T,b)" should appear on line 28.

Column 6, line 11, "$\omega$" should read --$\Omega$--; lines 41, 42, 45, 46, 48 and 53, over each "p" in parentheses there should be an arrow ($\rightarrow$); line 46, "$\delta$" should read --$\sigma$--.

Column 7, lines 52 and 54, "E" should read --$\delta$--; line 58, "$\tau$" should read --$\delta$--; line 68, "{" should read --}--.

Signed and Sealed this

Fourth Day of September 1979

[SEAL]

Attest:

LUTRELLE F. PARKER
*Attesting Officer*         *Acting Commissioner of Patents and Trademarks*